United States Patent [19]

Epstein

[11] 4,263,506
[45] Apr. 21, 1981

[54] PULSE GENERATING APPARATUS
[75] Inventor: Howard C. Epstein, Los Altos, Calif.
[73] Assignee: Hewlett-Packard Company, Palo Alto, Calif.
[21] Appl. No.: 971,984
[22] Filed: Dec. 21, 1978
[51] Int. Cl.³ .............................................. G01D 5/34
[52] U.S. Cl. ........................... 250/231 SE; 250/237 G
[58] Field of Search ........ 250/237 R, 237 G, 231 SE; 356/395; 324/175; 340/347 P

[56] References Cited
U.S. PATENT DOCUMENTS 3,749,925  7/1973  Hertrich ......................... 250/231 SE
4,064,504  12/1977  Lepetit et al. ...................... 340/347 P Primary Examiner—David C. Nelms
Attorney, Agent, or Firm—Michael L. Sherrard

[57] ABSTRACT

A three-channel optical shaft angle encoder has two channels for encoding the incremental angle and the direction of rotation of a shaft. A third channel provides a synchronizing index pulse for encoding the absolute position of the shaft once per revolution. The encoder has an emitter module containing three high irradiance LED emitters and integral truncated collimating lenses for producing three closely spaced collimated light beams, one beam for each channel. These light beams are modulated as a function of the relative angle between a code wheel coupled to the shaft and a phase plate fixedly mounted to the body of the encoder. The modulated light beams are received by a detector module having beam splitting truncated and siamesed lenses positioned to split each of the closely spaced light beams and to focus each of the split beams onto a photo detector pair. The photo diode pairs are coupled to balanced hysteretic optical comparators which provide analog and digital output in response to the position and direction of rotation of the shaft.

6 Claims, 20 Drawing Figures

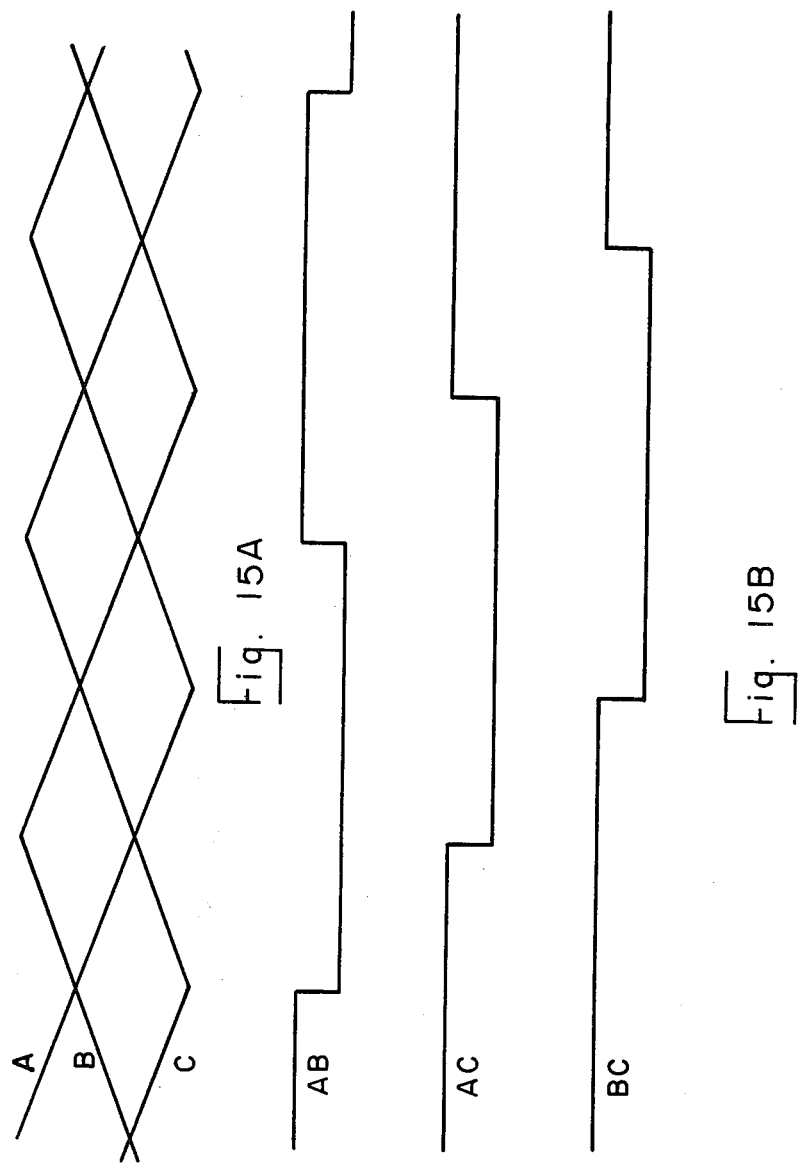

PULSE GENERATING APPARATUS

BACKGROUND AND SUMMARY OF THE INVENTION

The preferred embodiment of the present invention an index pulse to provide an absolute indication of the position of the code wheel. The described encoder provides a push-pull system using two tracks on an opaque code wheel to produce an index pulse. Applicant is not aware of any prior push-pull systems using opaque code wheels. By periodically providing structural sections so as to maximize the separation between the two signals of the push-pull system at positions other than those near the index position, an opaque code wheel which has a low possibility of a false comparison is provided. This provides an index pulse which is relatively immune to noise induced error.

DESCRIPTION OF THE DRAWINGS

FIGS. 15A and 15B are illustrations of waveforms of signals from the three-phase encoder of FIG. 14.

DESCRIPTION OF THE PREFERRED EMBODIMENT

Figure 1:
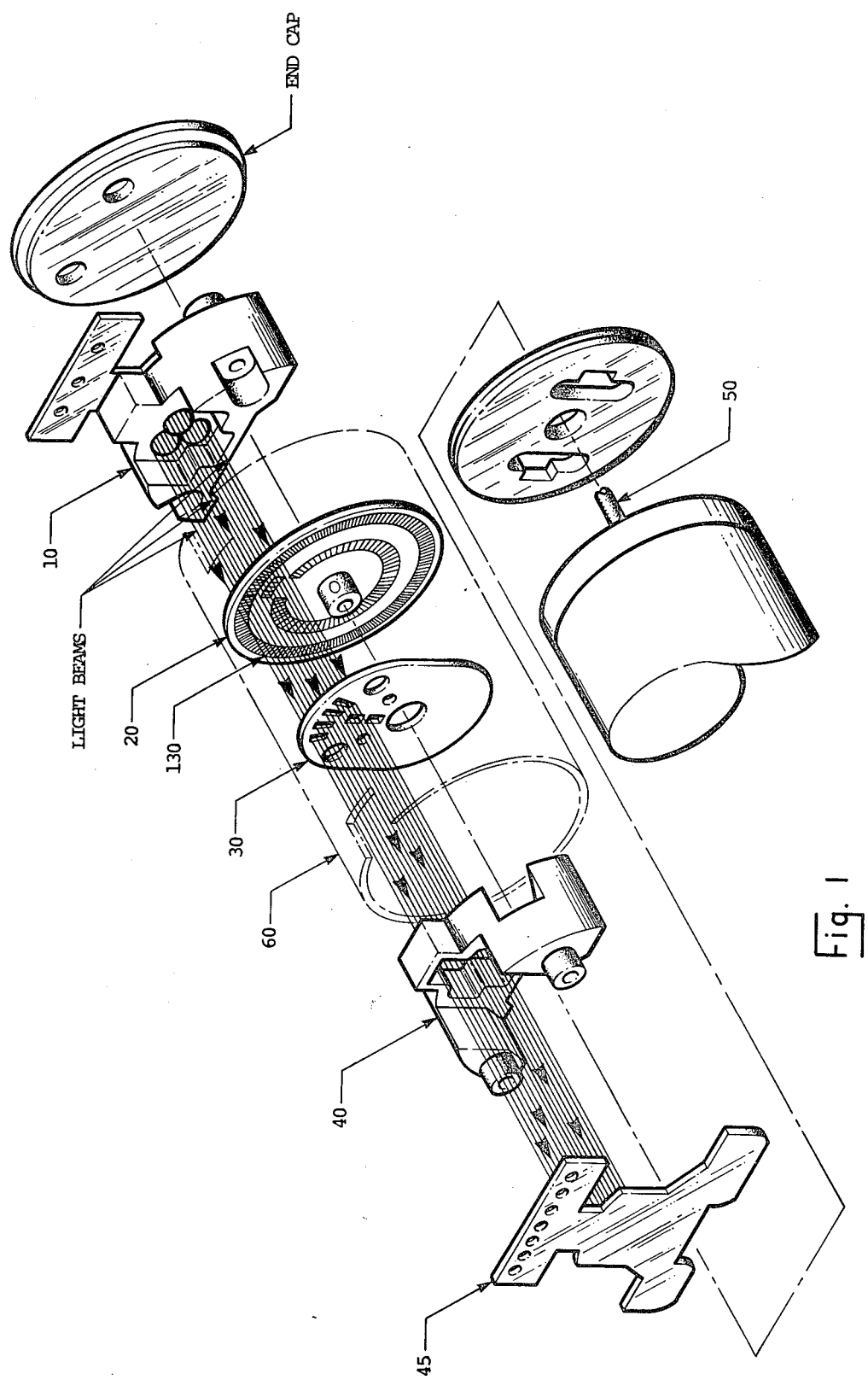
FIG. 1 is an exploded perspective view of a shaft angle encoder constructed in accordance with the preferred embodiment of the present invention.

An exploded view of the preferred embodment of the present invention is illustrated in FIG. 1. Three collimated light beams are provided by emitter module 10 and are modulated by a code wheel 20 and a fixed phase plate 30. The modulated light beams are split and focused by a detector module 40 and directed to photo detectors on circuit board 45. The photo detectors are coupled to comparator circuits for providing digital and analog output signals responsive to the relative angle between the code wheel and the phase plate. Code wheel 20 and phase plate 30 are coupled to a shaft 50 and a housing 60 respectively. Thus, the output signals are responsive to the relative angle between the shaft and the housing.

Emitter Module

Figure 2:
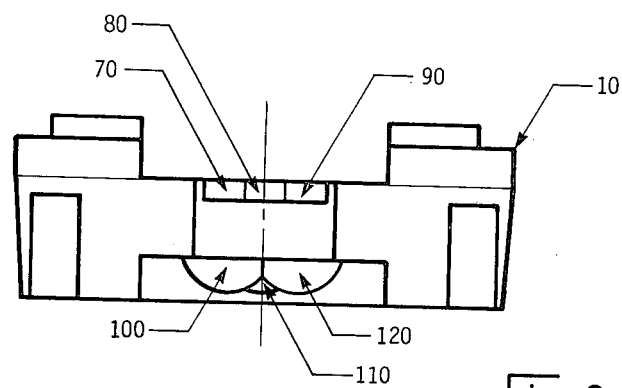
FIG. 2 is a top view of the emitter module.
Figure 3:
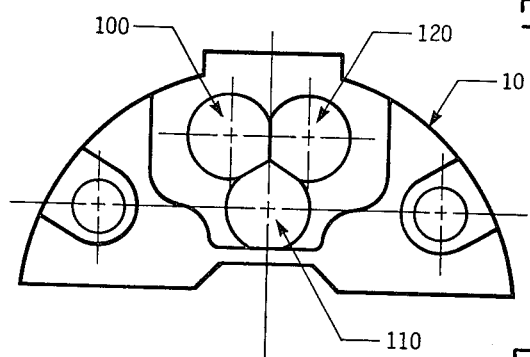
FIG. 3 is a front view of the emitter module.

The emitter module 10 is shown in detail in FIGS. 2 and 3. Three light emitting diodes (LEDs) 70, 80, and 90 provide light having a wavelength of approximately 700 nanometers. Emitter lenses 100, 110, and 120 are positioned to receive the light from the LEDs and to provide the three collimated light beams. In the preferred embodiment, each emitter lens is an aspheric lens known as an aplanat. The three aplanat lenses are molded from a single piece of plastic and have been truncated, that is, the optical axes of the lenses have been placed close together such that the circumferences of the lenses intersect. This results in asymmetric and closely spaced lenses wich provide well collimated beams of uniform intensity.

A stated, the preferred embodiment uses light having a wavelength of 700 nanometers. However, any frequency of electromagnetic radiation having a wavelength substantially shorter than the relevant dimensions of the encoder could be utilized in the present invention if suitable lens materials, emitters and detectors are available.

Code Wheel

Figure 4:
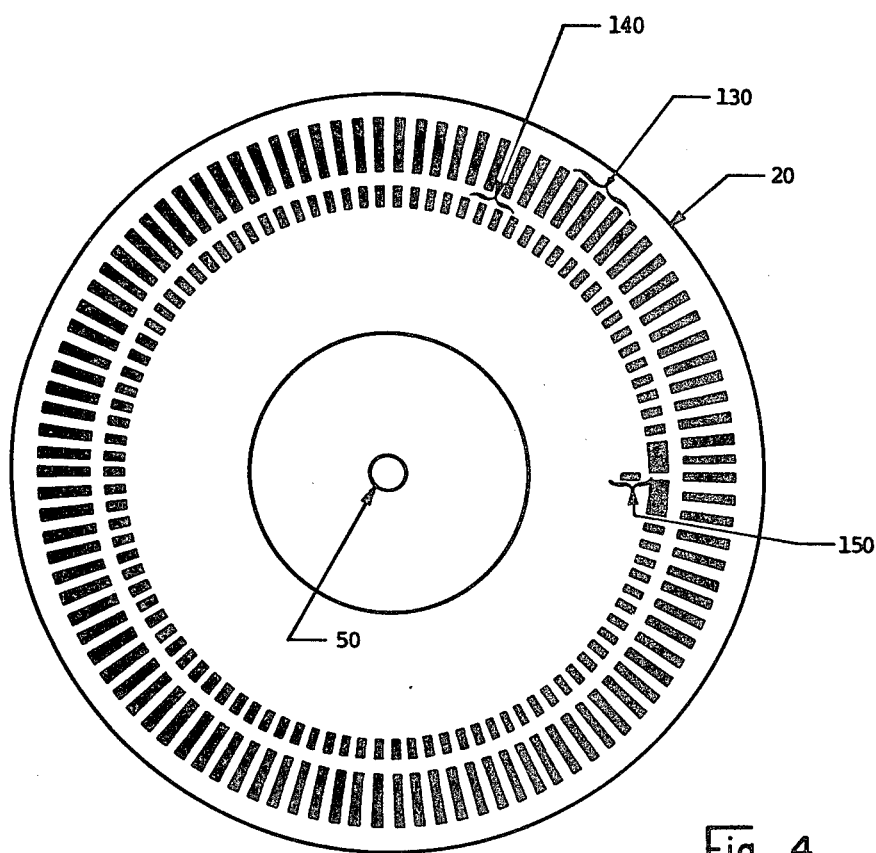
FIG. 4 is a front view of the code wheel with transparent areas illustrated in black and opaque areas illustrated in white.

Code wheel 20 is illustrated in detail in FIG. 4. The code wheel is positioned to receive the collimated light beams from emitter module 10 and is concentrically mounted to shaft 50 for rotation relative to the phase plate. Optical tracks on the code wheel modulate the light beams for encoding the relative angle between the code wheel and the phase plate. In the preferred embodiment, the code wheel is made of an optically opaque material. An outermost track 130 has 102 transparent slits illustrated as black areas in the figures. The two light beams from emitter lenses 100 and 120 are directed to this outermost track for providing the two channels of information required to determine the incremental movement and the direction of rotation of the shaft. The second and third radial tracks 140 and 150 on the code wheel modulate the third light beam from emitter lens 110 and provide a balanced, synchronizing index pulse which determines the absolute angle of the shaft once per revolution.

Phase Plate

Figure 5:
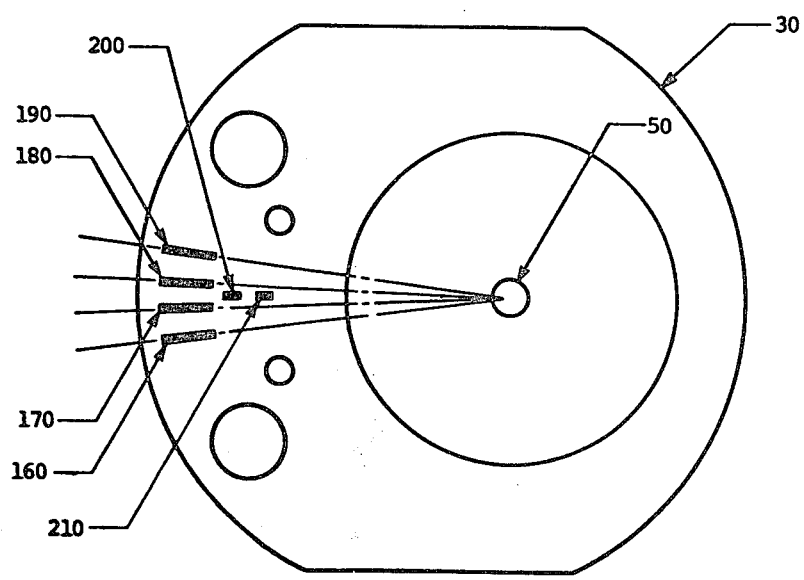
FIG. 5 is a front view of the phase plate with transparent areas illustrated in black and opaque areas illustrated in white.

Phase plate 30 is shown in more detail in FIG. 5. The phase plate is mounted to housing 60 and aligned concentrically relative to the shaft 50 such that the relative angle between the phase plate and the code wheel changes as the shaft rotates. A first modulated light beam passing through track 130 of code wheel 20 is received by phase plate areas 160 and 170. In the preferred embodiment areas 160 and 170 have equal areas and each comprises an optically transparent slit illustrated in black in the figure. Each area has an arc dimension equal to the arc dimension of the slits on track 130 of the code wheel. Areas 160 and 170 may have radial dimensions slightly larger or smaller than the radical dimension of the slits on track 130 to minimize sensitivity to radial misalignment and variation in the radial dimension of the areas and slits. Further, phase plate areas 160 and 170 are 180° out of phase relative to the periodic spacing between the slits of track 130. Thus, as the code wheel turns, the light passing through each phase plate area alternately achieves a maximum and a minimum, i.e., when the light passing through optical area 160 reaches a maximum, the light passing through optical area 170 reaches a minimum, and when the light passing through optical area 170 reaches a maximum, the light passing through optical area 160 reaches a minimum. The intensity of light from each area will have a triangular wave-shape having 102 maxima for each revolution of the code wheel relative to the phase plate. Thus, light passing through these areas will be of equal intensity 204 times per each revolution of the code wheel. These times correspond to crossings of signals responsive to the radiant power passing through the optical areas 160 and 170 respectively. These crossings are detected by a comparator to provide signals responsive to changes in the relative angle between the code wheel and the phase plate.

Optical areas 180 and 190 have dimensions equal to the dimensions of optical areas 160 and 170 and receive a second light beam modulated by track 130 of code wheel 20. Optical areas 180 and 190 are 180° out of phase relative to each other, and are in quadrature, that is, 90° out of phase relative to optical areas 160 and 170. This quadrature relationship provides a second channel of information. By comparing the two channels, the direction of rotation of the code wheel relative to phase plate 30 can be determined.

Phase plate 30 also has optical areas 200 and 210 each having an arc dimension of approximately "d" as illustrated in FIGS. 5 and 10, and aligned with optical tracks 140 and 150 respectively. The light passing through optical area 200 is 180° out of phase relative to the light passing through optical area 210 as a result of the construction of optical tracks 140 and 150. The crossings of these light waveforms provide synchronizing index pulses used to encode the absolute position of the code wheel relative to the phase plate once per revolution.

Figure 6:
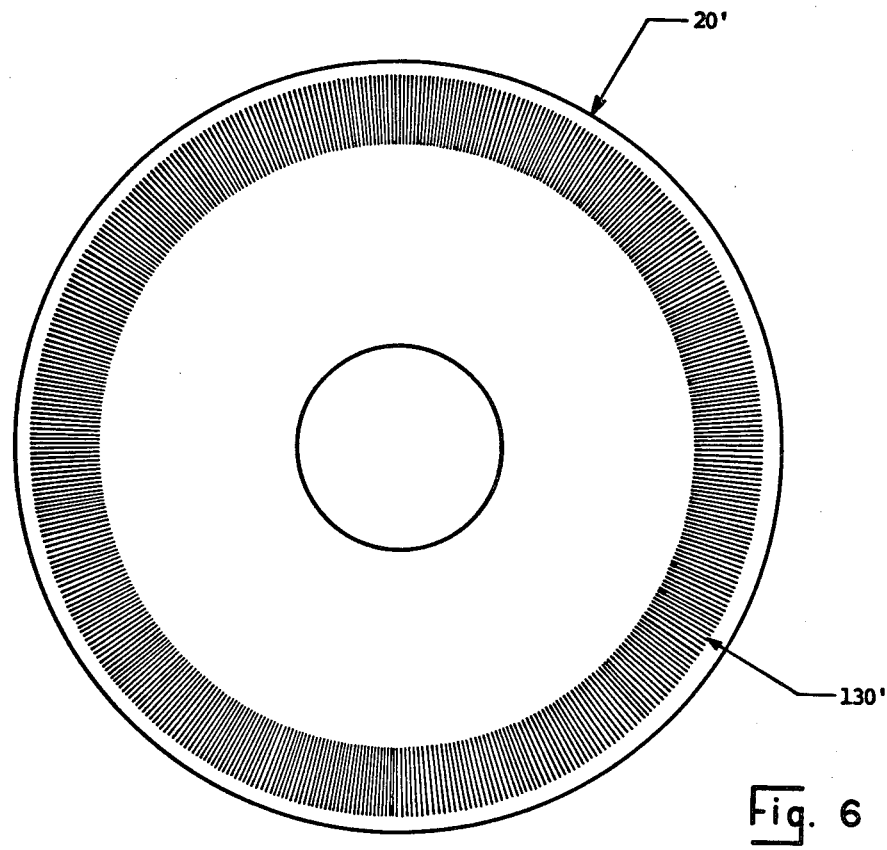
FIG. 6 is a front view of an alternative code wheel with transparent areas illustrated in black and opaque areas illustrated in white.
Figure 7:
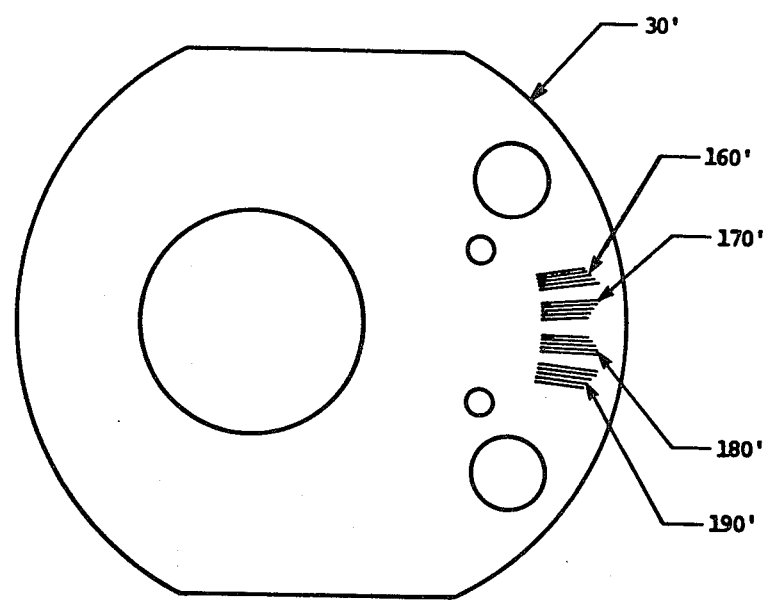
FIG. 7 is a front view of an alternative phase plate with transparent areas illustrated in black and opaque areas illustrated in white.

FIGS. 6 and 7 illustrate an alternative embodiment of the code wheel and phase plate respectively. The optical 130' has 500 transparent slits. In order to increase the light transmitted by each optical area of the phase plate, each optical area have five optically transparent slits having dimensions and spacings the same as the slits on track 130'. Thus, 1000 crossings are detected each revolution. Alternatively, other numbers of slits could be used to provide increased transmittance of the light beams through the phase plate.

Index Pulse

Figure 10A:
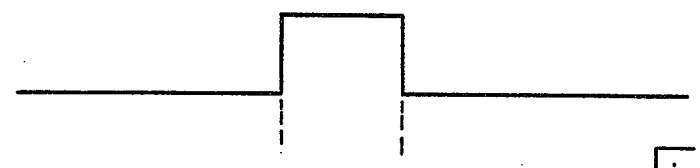
FIGS. 10a, 10b, 10c, and 10d illustrate waveforms, code wheel tracks, and detector geometries related to the generation of the index pulse. Transparent areas are illustrated in black and opaque are illustrated in white.
Figure 10B:
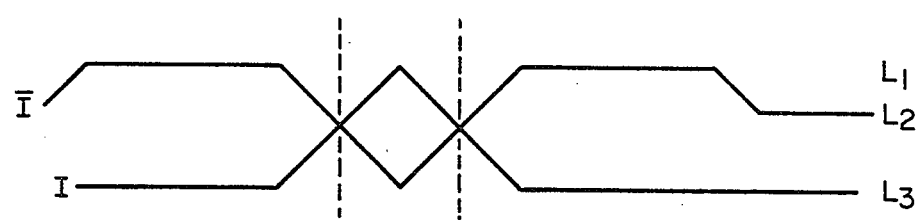
Figure 10C:
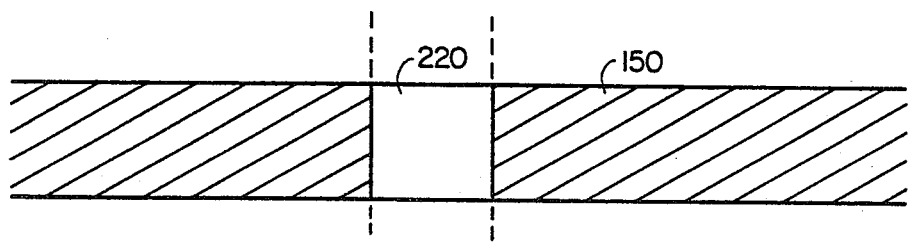
Figure 10D:
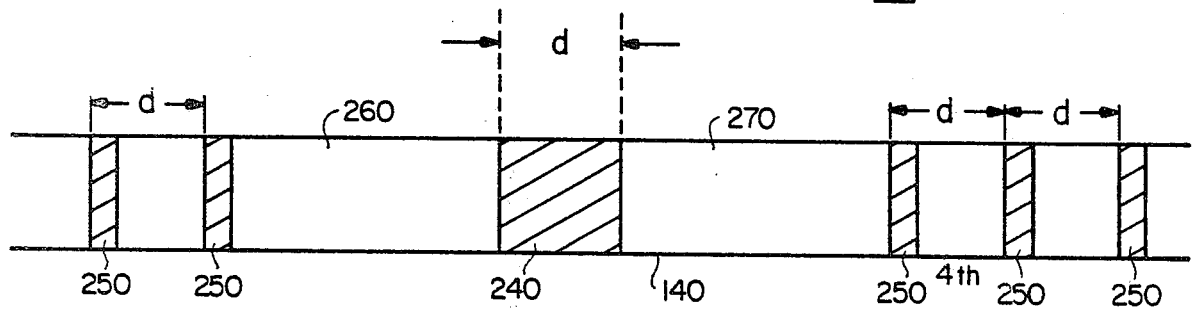

The desired pulse shape for the index pulse is shown in FIG. 10A. This pulse is provided and sychronized with the code wheel angle as follows. A push-pull system using tracks 140 and 150 on code wheel 20 provides signals I and Ī illustrated in FIG. 10B. These waveforms are compared by an optical comparator and the index pulse is generated in response to signals I and Ī attaining equal amplitudes. The signal is provided by a detector which is responsive to light passing through the slits 200 and 210, which have substantially equal dimensions. This provides a waveform I having the triangular waveform illustrated. The waveform Ī, however, is difficult to achieve with an opaque code wheel. Ideally, the track on the code wheel would be clear with a single opaque section 240 having dimensions equal to the dimensions of slit 200 on the phase plate. This could be accomplished using a transparent code wheel. However, it is desired to be able to construct a code wheel of opaque material. In an opaque material, a clear track, that is, a track void of material except for an opaque section, would be structurally unstable. It is therefore required that structural members 250 be placed across the clear track to support the outer portions of the code wheel as illustrated in FIG. 10D. It is desired to maximize the separation between the signals I and Ī to reduce the possibility of a false comparison due to noise. Therefore, in the illustrated preferred embodiment, track 140 is characterized by an opaque section 240 having an arc dimension substantially equal to the arc dimension of slit 200 and surrounded by two clear sections 260 and 270 having arc dimensions equal to or greater than the arc dimension of slit 200. Structural members 250 are spaced periodically relative to the arc dimension of slit 200 so that the intensity of the beam Ī stays at a relatively constant level $L_2$ as the position of the detector relative to the periodic structural members 250 on track 140 varies. The width of the support members is chosen to provide adequate structural strength but at the same time to minimize the loss of light to keep the difference ($L_2-L_3$) between the signals I and Ī as great as possible except near the comparison points.

Detector Module

Figure 8:
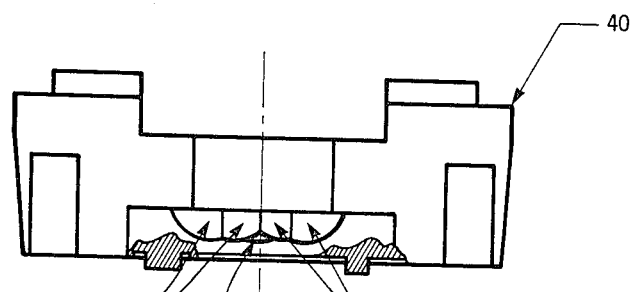
FIG. 8 is a top view of the detector module.
Figure 9:
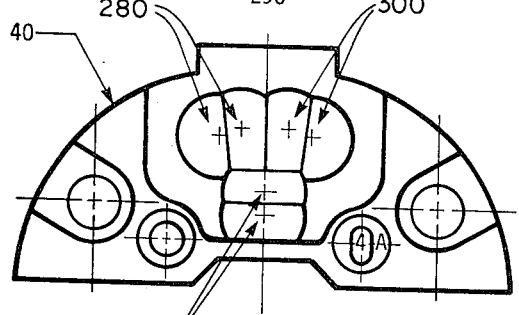
FIG. 9 is a front view of the detector module.

Detector module 40 illustrated in FIG. 8 and 9 consists of three detector lenses. The three detector lenses 280, 290, and 300 are bifurcated, truncated lenses, each positioned to receive a modulated light beam from one of the emitter lenses. The detector lenses receive this light modulated by the code wheel and the phase plate, and splits and focuses the two components of each beam. Specifically, detector lens 280 will receive the light passing through optical areas 160 and 170 of phase plate 30 and split and focus the light passing through each of these optical areas at first and second positions. Each lens is made up of two siamesed and truncated elements having the optical axes close together. In order to get the optical axes of the two elements in each lens close together, the lenses have been "siamesed", i.e., each lens is bifurcated and has two contiguous elements as illustrated in FIG. 9. Each element has a substantially radial symmetry about its optical axis and the sum of the maximum radii of the contiguous elements is greater than the distance between the optical axes. Thus, there is a plane of intersection between the elements positioned midway between the optical axis which truncates the otherwise radially symmetric elements. This provides lenses which have elements of a size adequate to ensure good efficiency and have closely spaced optical axes. These elements are positioned such that each element will receive light passing through one of the optical areas. Further, each lens is truncated similar to the emitter lenses and closely spaced relative to the other lenses. Eccentricity errors are proportional to the distance between the optical areas. Thus, the optical areas can be placed close together resulting in the encoder being relatively insensitive to eccentricity errors. Also, the photodiode detectors are closely spaced, allowing for a reduction in size of the detectors.

Each of the three detector lenses has been designed in accordance with well known techniques to provide easily molded surfaces and to provide well collimated light having a uniform intensity. The focal length of the elements is approximately 75 mils and the lenses are made of a polycarbonate which has an index of refraction at 700 nanometers of $N=1.570$. The focal lengths of the emitter and detector lenses are equal so that there is no magnification effect.

Circuit Board

Figure 11:
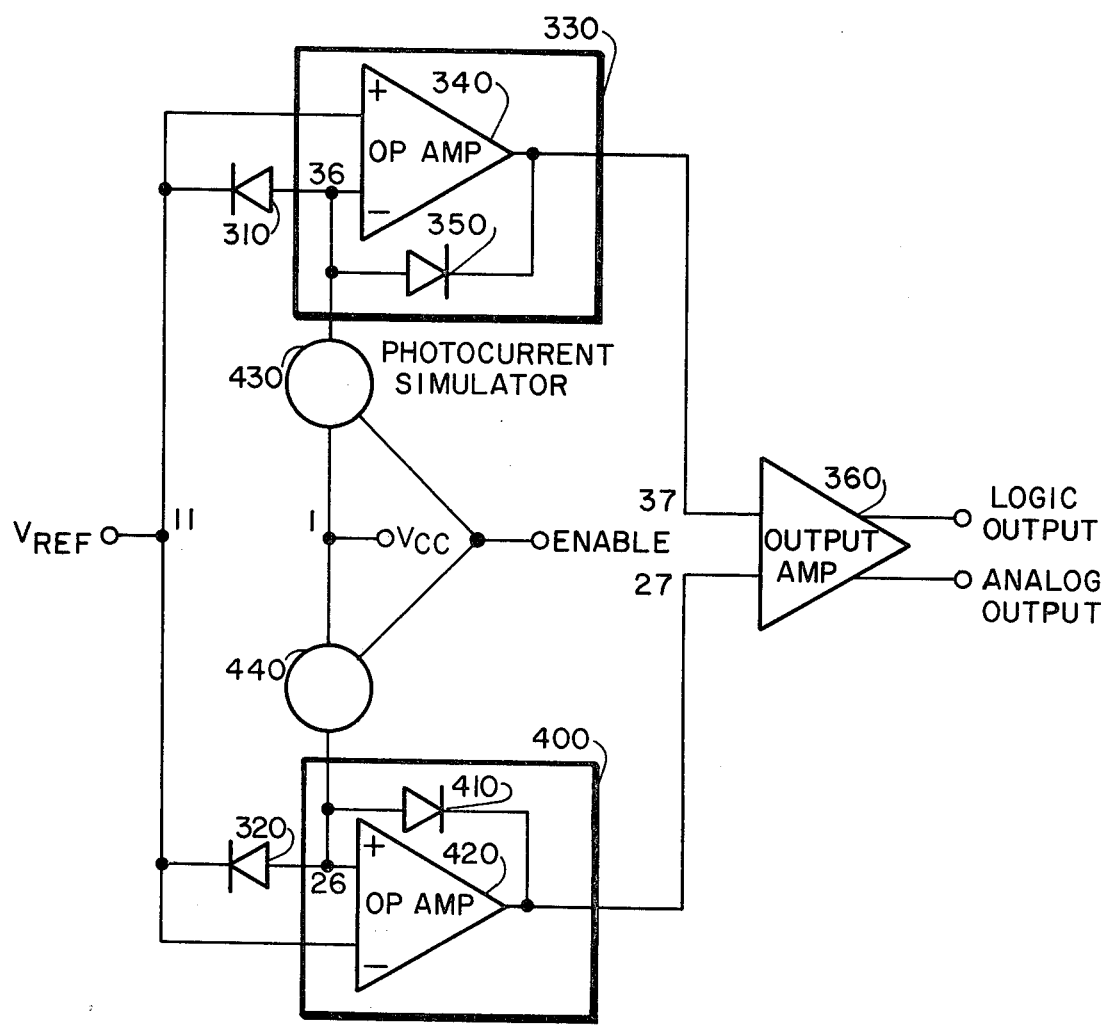
FIG. 11 is a general block diagram of an optical comparator.

Photo detectors 310 and 320 illustrated in FIG. 11 reside in an integrated circuit with an optical comparator on circuit board 45. The comparator determines which detector receives the most light and provides an output in response thereto. FIG. 11 shows a general block diagram of this optical comparator. There is one optical comparator for each channel. Each comparator provides two output signals. The first output signal is a logic level which indicates which of the two photo detectors receives the most light. The second output signal is an analog signal related to the ratio of the two light levels. In the preferred embodiment, the photo detectors 310 and 320 are collector-base junctions of NPN integrated transistors. It is desired to operate the photo detectors at a constant voltage into a low impedance amplifier to reduce the response time caused by the capacitance of the photo diodes. This desired low impedance is obtained at the inverting input of an operational amplifier. This amplifier raises the amplitude and lowers the impedance of the input signal. As illustrated in FIG. 11, preamplifier 330 is coupled to the first photo detector 310 and consists of an operational amplifier 340 and a feedback element 350. The operational amplifier has a bias current $i_b$ which flows into node 36 and through the feedback element in the same direction as the photo current $i_p$.

In operation, a change in the photo current though photo detector 310 produces a change in the voltage at the inverting input of the operational amplifier, node 36. The output voltage of the amplifier, at node 37, changes by a larger amount and in the opposite direction. The resulting voltage change across feedback element 350 causes a change in the current therethrough which cancels the original change in the photo current. The current to voltage conversion of preamplifier 330 thus depends on the voltage to current characteristics of feedback element 350. This coupling of a feedback element from the output to the inverting input of an operational amplifier results in a circuit known as a transimpedance amplifier. Ordinarily, a resistor would be used for the feedback element, but the high value needed and the requirement that preamplifiers 330 and 340 be closely matched are not compatible with integrated circuit processing. Thus, in the preferred embodiment, a forward-biased diode is used for the feedback element. The impedance of this PN junction at 100 nanoamps in room temperature is about 260 kilo-ohms. The diodes also take up less area than resistors, can be very well matched, and have a non-linear logarithmic characteristic. This non-linearity does not affect the comparator function, described below, because the point of comparison is determined by the operation of the two diodes at the same level. In addition, as will be further explained below, the non-linearituy is not only compensated for but is especially useful in the derivation of the analog output of the detector.

Bias Supply

Figure 12:
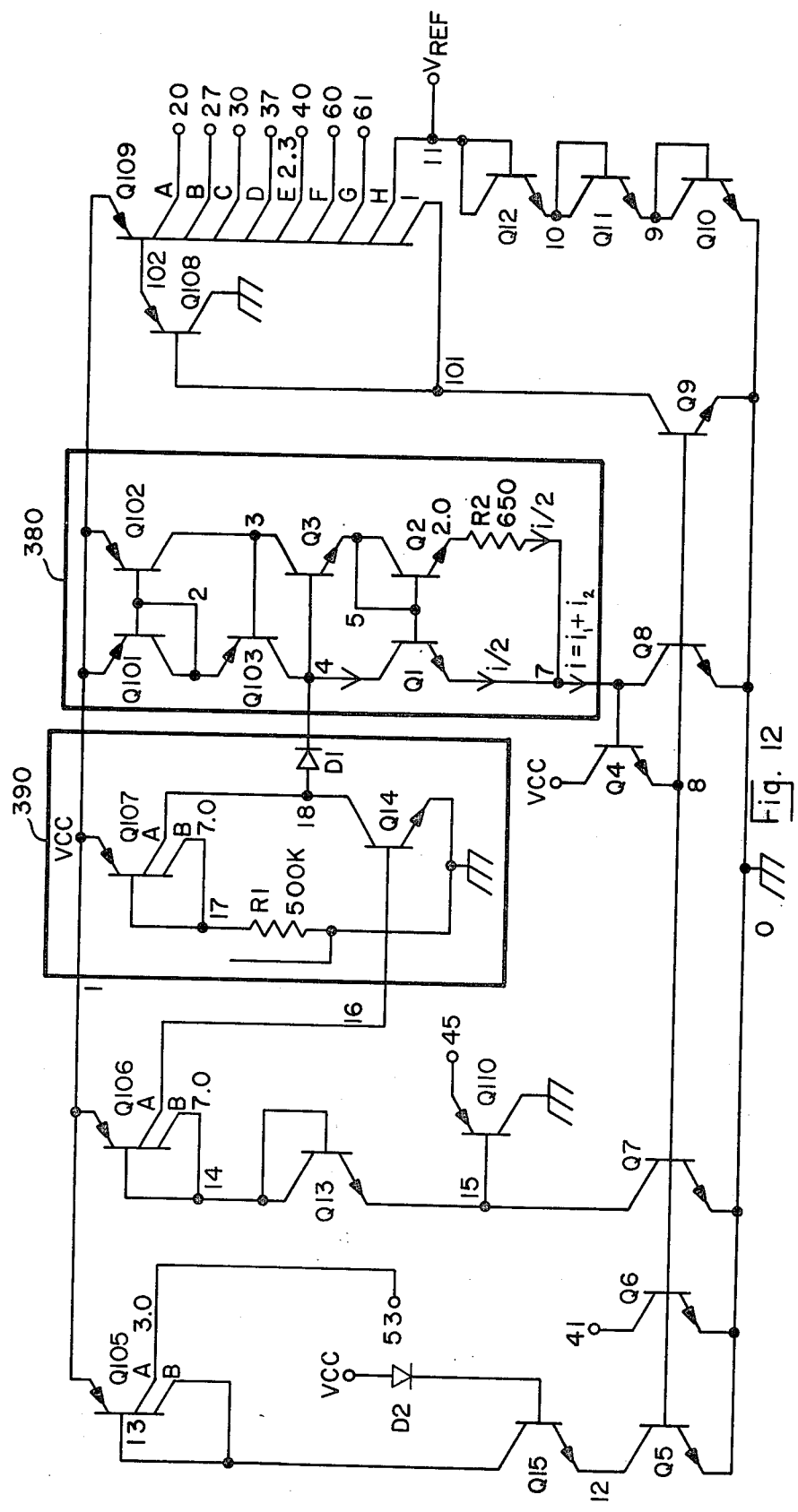
FIG. 12 is a detailed schematic diagram of the bias supply for the optical comparator of FIG. 11.

The bias supply illustrated in a detailed schematic diagram, FIG. 12, uses a band-gap reference current source replicated a number of times. A voltage reference is established by passing a constant current through three-series connected diodes.

The basic current reference 380 is made up of transistors Q1, Q2, Q3, Q101, Q102, Q103 and resistor R2. PNP transistors Q101, Q102 and Q103 form a Wilson current mirror which injects a current into node 4 equal to the current passing through node 3. Q103 improves the accuracy of the basic mirror by increasing the output impedance and compensating for the base current of Q101 and Q102. Transistors Q1, Q2 and Q3 form a similar Wilson current mirror except that transistor Q2 has twice the active area of Q1 and has a resistor R2 in its emitter circuit. This mirror draws a current from node 3 responsive to the current into node 4. At low current, the voltage drop across R2 is small. Thus, for an equal emitter-base voltages, transistor Q2 will generate a current twice that of transistor Q1, and the current through node 3 from the NPN current mirror is double the current through node 4. The PNP current mirror will sense the double current from transistor Q2 and continue to increase the current through transistor Q1 and node 4. This current will again be multiplied by transistor Q2 until the current through R2 causes a voltage drop across R2 which reduces the emitter-base voltage of Q2 in an amount sufficient to limit the current from transistor Q2 by a factor of one-half. The voltage drop across R2 which corresponds to this 2 to 1 current change is approximately 16 millivolts at room temperature. Thus, the current (i) through resistor R2 current reference is equal to V/R, where V is the voltage required to reduce the emitter-base voltage of Q2 by an amount sufficient to compensate for the difference in areas between transistor Q1 and Q2 and R is the resistance of resistor R2. In the preferred embodiment, the current through each transistor is about 25 microamps and the output current i is approximately 50 microamps.

A startup circuit 39 is provided to ensure that the basic current reference 380 does not stabilize at a 0 current. Resistor R1 produces a small current into PNP mirror Q107 which provides current through diode D1 into node 4. Mirror Q107 returns only one-seventh of its input current which minimizes power consumption. Once the bias loop is operating properly, Q14 turns on which pulls node 18 to a low level and diode D1 isolates the bias loop from the start-up circuit.

Transistor Q14 is driven with a nominal 7 microamp current generated by the 1:7 mirror Q106. Q106 is driven by a transistor Q7. A current generated by transistor Q7 is also used to bias Q110, the output analog clamp, which is coupled to transistor Q106 and diode connected transistor Q13 to set node 15 to $2V_{be}$ below VCC. This sets the base voltage for transistor Q110 which will conduct if its emitter rises above VCC minus $V_{be}$.

The basic current reference provides a 50 microamp current into node 7. The voltage at node 7 will increase until transistor Q4 provides enough current to node 8 to cause transistor Q8 to conduct essentially all of the 50 microamps from bias loop 380. The current through Q8 is replicated in transistors Q5, Q6, Q7, and Q9, since the bases of these transistors are coupled to node 8 and the emitters of these transistors are coupled together at node 0. The current from the collector Q9 is coupled in a similar manner to transistor Q108 and transistor Q109 to provide a number of outputs from Q109 which conduct nominal 50 microamp currents.

A logic pull-up current is generated by transistor Q105. Transistor Q105 is driven by transistor Q5. To further isolate this logic pull-up current from the main bias loop, transistor Q15 is cascaded with transistor Q5 and biased by diode D2. This pull-up current has an amplitude of approximately 150 microamps.

The voltage reference, $V_{ref}$, is developed across diode connected transistors Q10, Q11 and Q12 by a 50 microamp current from transistor Q109.

Output Amplifier

Figure 13:
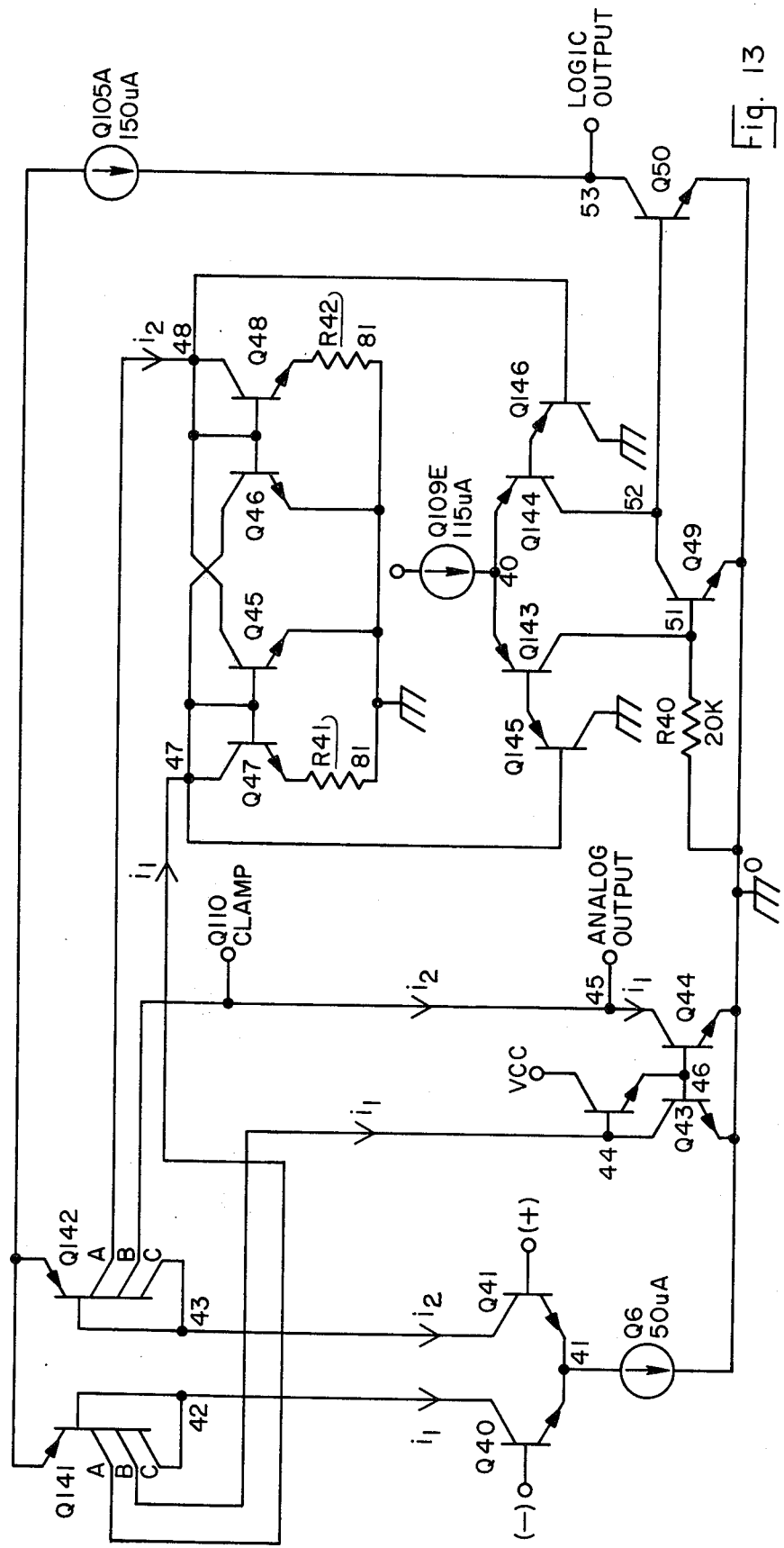
FIG. 13 is a detailed schematic diagram of the output amplifier of the optical comparator of FIG. 11.

Output amplifier 360 is shown in further detail in the schematic diagram FIG. 13. The outputs from operational amplifiers 340 and 420 are coupled to the bases of the transistors Q41 and Q40 respectively. These transistors form a differential pair 365 and are matched in size and geometry to the diode connected transistors 350 and 410 in the feedback loops of transimpedance amplifiers 330 and 400. Thus, the transformation of current to voltage in differential pair 365 is the inverse of the transformation accomplished by the transimpedance amplifiers. Therefore, the ratio of the photo currents is converted into a voltage difference by the transimpedance amplifiers and converted back to a current ratio by transistors Q40 and Q41. The collector currents of transistors Q40 and Q41 have the same ratio as the photo currents. However, the sum of the collector currents is the nominal 50 microamps provided by current source Q6. Thus, assuming that the two optical signals are generated by the same light source, the currents out of the differential pair Q40 and Q41 will reflect only the ratio of the two optifcal path losses, i.e., the position of the shaft.

The currents I1 and I2 from differential pair Q40 and Q41 are mirrored by PNP transistors Q141 and Q142. The mirrored current I1 from terminal B of transistor Q141 is mirrored again by transistors Q42, Q43, and Q44 to provide a current sink having a magnitude I1. The mirrored current I2 from terminal B of transistor Q142 provides a current source having a magnitude I2. These two currents, one a source and the other a sink, are coupled at terminal 45. If the two currents are equal, no net current is provided to terminal 45. However, if the two currents are not equal, the result is a net current either into or out of terminal 45. This analog current signal is the difference between the two currents whose sum is constant and whose ratio is the same as the ratio of the original photo currents. That is:

$$I_{out} = (X-Y) \div (X+Y) * 50 \text{ microamps}$$

where X and Y are the photo currents in photodetectors 310 and 320 respectively. Since the photo currents are linearly related to the shaft position, the output current $I_{out}$ is also linearly related to the shaft position.

A logic output is provided to indicate which of the two photo currents is greater. This logic output is characterized by hysteresis which requires that driving signal go past a point of equality before the output swiches. Near the ideal switching point, a portion of the circuit is bistable. Referring to FIG. 13, transistors Q141 and Q142, described above, provide replicated currents I1 and I2 at terminals Q141A and Q142A. Transistors Q45 and Q46 are cross-coupled and form a bistable flip-flop. The currents I1 and I2 from transistors Q141 and Q142 are coupled to the flip-flop to provide the opposing set and reset currents. Diode connected transistors Q47 and Q48 reduce the effective gain of transistors Q45 and Q46 to a value slightly greater than 1, i.e., approximately 1.1). The flip-flop is thus a pair of current mirrors, with each mirror stealing control current from the other. Transistors Q47 and Q48 have resistors R41 and R42 in their respective emitter circuits, which increases the base voltage to transistors Q45 and Q46. Thus, each side of the flip-flop can sink slightly more current than its input, thereby providing the hysteresis. Resistors R41 and R42 are one-eighth the value of resistor R2 which controls the operating point of the main bias loop. In this circuit, the amount of hysteresis is controlled by the resistor ratio R41 divided by R2 and not by any absolute resistor values. This is a result of transistor Q47 conducting as much current as transistor Q2 at the switching point, i.e., I1 approximately equal to I2). Since resistor R41 has one-eighth a resistance of R2, but carries the same current, the voltage drop across R41 is one-eighth the voltage drop across resistor R2. Since the current through a transistor is an exponential function of the applied voltage, and the voltage developed across R2 equals the voltage difference corresponding to a 2 to 1 current ratio, the voltage drop across resistor R41 corresponds to a $8\sqrt{2}$ current ratio. Transistor Q45 has a base to emitter voltage greater than the base to emitter voltage of transistor Q47 by the amount equal to the voltage drop across resistor R41, thus, the current through transistor Q45 is approximately $8\sqrt{2} * I_1$, approximately 1.09 $I_1$). At the operating point, each mirror can sink 9% more current than the controlling input signal. Thus, $I_2$ must exceed $I_1$ by approximately 9% before the flip-flop changes state. Transistors Q46 and Q48 and resistor R42 operate in a similar manner to provide hysteresis during the reverse change of state. The amount of hysteresis is reduced by the finite beta of the transistors, but the change of state will be abrupt even if the currents vary slowly as long as the transistors Q45 and Q46 can sink more current than I1 and I2 respectively (or Q47 and Q48).

The state of the Q46, Q45 flip-flop becomes the logical output. This output is sensed by the differential pair Q143 and Q144 and buffered by transistors Q145 and Q146. The current from source Q109E is switched to drive either transistor Q49 or Q50. Transistor Q49 is provided to speed the turn off of transistor Q50. When Q50 is off, the output is pulled to a high voltage level by transistor Q105Q. Resistor R40 helps to turn transistor Q49 to its non-conductive state.

A photo simulator injects a controlled amount of current into the photo diodes, simulating the effect of light. This photo simulator can be used to allow wafer sorting of the circuits without controlled light sources. It may be also useful for trimming and balance or adding a substantial imbalance to convert the detector to an absolute threshold detector instead of a push-pull detector. Photo current simulators 430 and 440 are illustrated in FIG. 11. Each selectively provides a current having a magnitude of approximately a fraction of a microamp to operational amplifiers 340 and 420 for simulating the effects of a light beam.

Multiphase Encoder

Figure 14:
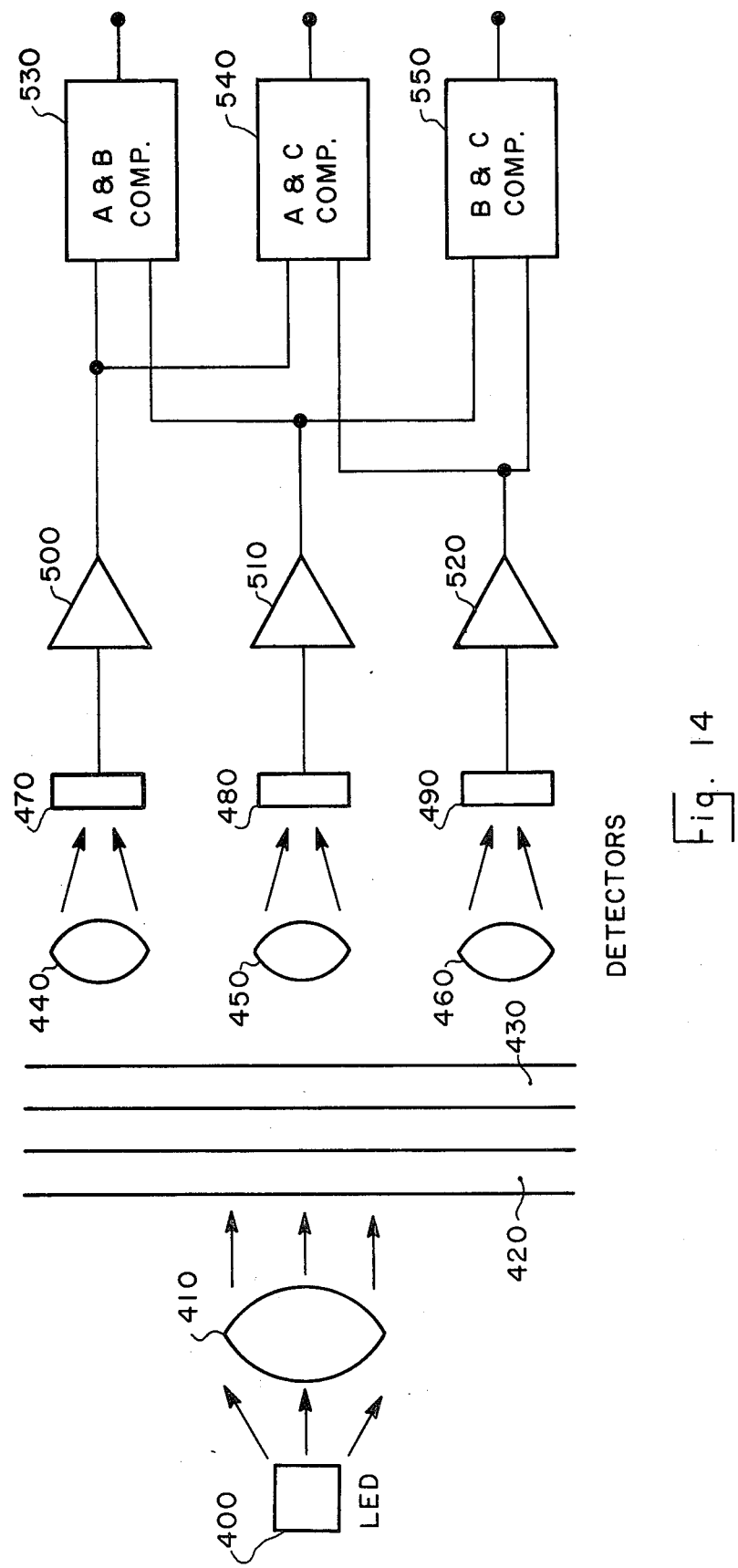
FIG. 14 is a block diagram of a three-phase encoder.

The preferred embodiment of the present invention uses four detectors spaced at 90° intervals. However, the number of detectors and the spacing of the detectors can be varied without departing from the scope of the invention. For instance, an encoder could be designed using three detectors spaced at 120° intervals. Such an encoder is illustrated in FIG. 14. In FIG. 14, an LED 400 provides light to a collimating lens 410. The collimated light is modulated by a code wheel 420 and a phase plate 430 as a function of the shaft angle and is focused and detected by trifurcated and truncated detector elements 440, 450, and 460, and detectors 470, 480 and 490. The three output signals from the detectors are then processed by preamplifiers 500, 510 and 520. The outputs of the preamplifiers are coupled to three comparators 530, 540 and 550. Comparator 530 compares the output signals from preamplifiers 500 and 510, comparator 540 compares output signals from preamplifiers 500 and 520, and comparator 550 compares output signals from preamplifiers 510 and 520. These output signals from the preamplifiers are illustrated in FIG. 15A. Waveforms A, B and C are the waveforms of the output signals from the preamplifiers 500, 510 and 520 respectively. Digital outputs from the comparators are illustrated in FIG. 15B. The waveform AB is the output from comparator 530, the waveform AC is the output from comparator 540, and the waveform BC is the output from comparator 550. Thus, the output from the comparators provide six transitions per cycle instead of the four transitions per cycle as illustrated in the preferred embodiment. Thus, the illustrated three phase encoder has six substates per cycle rather than the four substates of the preferred quadrature system. As a result, for the same mechanical resolution, the cycle spacing could be larger which might effect the cost or manufacturing the code wheels. For instance, a 400 count code wheel using the three phase system would give 2400 transitions per revolution, the same as a 600 count wheel using a quadrature system. Although the angular resolution required would be the same, the lower slit count of the three phase encoder uses wider areas which are easier to manufacture. Further, an opaque material code wheel would have a higher mechanical stiffness and a higher resonant frequency. Further, the three lenses of the three phase system occupy less room than the four lenses of the quadrature system which results in a reduced sensitivity to mechanical assembly tolerances. Further still, in addition to the two and three phase systems described, other multiple phase systems could utilize the invention as herein described and claimed. Further, many features of the present invention may be encoded in a linear position encoder by merely taking the special case of large radii, i.e., as the radius becomes very large, the track approaches linear. In this case, the described are dimensions correspond to linear dimensions along a line, the position on which is to be encoded.

I claim:

1. Pulse generating apparatus for a position encoder for generating a pulse at a position, the apparatus comprising:
    source means for providing light;
    light modulating means having first and second tracks aligned thereon to receive the light for modulating the light as a function of position thereon, the first track having a transmissive section having a first dimension along the length of the track, the second track having a non-transmissive index section having a second dimension, having transmissive sections each having a third arc dimension adjoining the non-transmissive index section on either side, and having a non-transmissive sections having fourth dimensions spaced periodically on either side of the transmissive sections at a period having a fifth arc dimension;
    said light modulating means constructed of an optically non-transmissive material and defining holes therein corresponding to the transmissive sections of said first and second tracks;
    detector means mounted for movement relative to the light modulating means having first and second optical areas aligned with the first and second tracks respectively and positioned so that the first optical area aligns with the transmissive portion of the first track when the second optical area aligns with the non-transmissive index section of the second track for providing first and second electrical signals in respone to the light received by the first and second optical areas respectively;
    said first optical area having a sixth arc dimension; said second optical area having a seventh arc dimension, the seventh arc dimension being substantially equal to the fifth arc dimension, the fourth arc dimensions being less than the fifth arc dimension; and
    comparator means coupled to the detector means to receive the electrical signals for generating a pulse in response to the light received at one optical area achieving a predetermined relationship relative to the light received at the other optical area.

2. Pulse generating apparatus for a position encoder as in claim 1 for generating an index pulse for an incremental shaft angle encoder in response to the shaft attaining a preselected position wherein:
    said light modulating means is a code wheel mounted on the shaft having the first and second tracks aligned concentrically thereon to receive the light for modulating the light as the shaft rotates;
    the first, second, third, fourth, fifth, sixth and seventh dimensions are arc dimensions; and
    said detector means is fixedly mounted for movement relative to the code wheel as the shaft rotates.

3. Pulse generating apparatus as in claim 1 or 2 wherein the second and third dimensions are substantially equal to or greater than the seventh dimension.

4. Pulse generating apparatus as in claim 3 wherein the sixth and seventh arc dimensions are substantially equal.

5. Pulse generating apparatus as in claim 4 wherein the first, second and sixth dimensions are substantially equal.

6. Pulse generating apparatus as in claim 5 wherein the fourth dimension is less than one-half the fifth dimension.

* * * * *

UNITED STATES PATENT AND TRADEMARK OFFICE
CERTIFICATE OF CORRECTION

PATENT NO. : 4,263,506
DATED : April 21, 1981
INVENTOR(S) : Howard C. Epstein

It is certified that error appears in the above-identified patent and that said Letters Patent are hereby corrected as shown below:

Column 1, line 7, delete "an index" and substitute -- produces an index --;

Column 2, line 17, delete "wich" and substitute -- which --;

Column 3, line 39, delete "cal 130'" and substitute -- cal track 130' --;

Column 5, line 45, delete "340" and substitute -- 400 --;

Column 6, line 25, delete "current reference";

Column 6, line 33, delete "39" and substitute -- 390 --;

Column 7, line 43, delete "*" and substitute -- X --;

Column 8, line 20, delete "*" and substitute -- X --;

UNITED STATES PATENT AND TRADEMARK OFFICE
CERTIFICATE OF CORRECTION

PATENT NO. : 4,263,506
DATED : April 21, 1981
INVENTOR(S) : Howard C. Epstein

It is certified that error appears in the above-identified patent and that said Letters Patent are hereby corrected as shown below:

Column 8, lines 20 and 21, insert -- ( -- before "approximately";

Column 8, line 39, delete "Q105Q" and substitute -- Q105A --;

Column 9, line 22, delete "or" and substitute -- of --.

Signed and Sealed this

Tenth Day of November 1981

[SEAL]

Attest:

Attesting Officer

GERALD J. MOSSINGHOFF

Commissioner of Patents and Trademarks